(12) United States Patent
Oh

(10) Patent No.: US 9,437,660 B2
(45) Date of Patent: Sep. 6, 2016

(54) ORGANIC LIGHT-EMITTING DIODE DISPLAY PANEL

(71) Applicant: LG Display Co., Ltd., Seoul (KR)

(72) Inventor: ChungWan Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/697,103

(22) Filed: Apr. 27, 2015

(65) Prior Publication Data

US 2015/0228701 A1 Aug. 13, 2015

Related U.S. Application Data

(62) Division of application No. 14/061,958, filed on Oct. 24, 2013, now Pat. No. 9,064,828.

(30) Foreign Application Priority Data

Nov. 19, 2012 (KR) .......................... 10-2012-0131157

(51) Int. Cl.
*H01L 27/32* (2006.01)
*H01L 51/52* (2006.01)
*H01L 51/00* (2006.01)

(52) U.S. Cl.
CPC ....... *H01L 27/3246* (2013.01); *H01L 27/3258* (2013.01); *H01L 27/3262* (2013.01); *H01L 27/3276* (2013.01); *H01L 51/0097* (2013.01); *H01L 51/5253* (2013.01); *H01L 51/5256* (2013.01); *H01L 2251/5338* (2013.01)

(58) Field of Classification Search
CPC .......... H01L 27/3246; H01L 27/3276; H01L 27/3258; H01L 27/3262; H01L 51/5252; H01L 51/0097; H01L 2251/5338; H01L 51/5253

See application file for complete search history.

(56) References Cited

U.S. PATENT DOCUMENTS 6,515,428 B1 * 2/2003 Yeh ...................... H01L 27/322
313/489
6,522,066 B2 * 2/2003 Sheu ..................... H01L 27/322
313/498

(Continued)

FOREIGN PATENT DOCUMENTS

CN 1413069 A 4/2003
CN 101273008 A 9/2008

(Continued)

OTHER PUBLICATIONS

First Notification of Office Action from The State Intellectual Property Office of China dated Aug. 2015, in counterpart Chinese application No. 201310548127.2.

(Continued)

*Primary Examiner* — Ida M Soward
(74) *Attorney, Agent, or Firm* — Morgan, Lewis & Bockius LLP

(57) ABSTRACT

Disclosed is an organic light-emitting diode (OLED) display panel. An OLED display panel includes a plurality of signal lines and a thin film transistor formed on a substrate, an interlayer insulating layer, a first electrode, a bank, an organic light-emitting layer, a second electrode, a first passivation layer, an organic layer, a second passivation layer and a barrier film, wherein the bank is formed to completely cover the interlayer insulating layer, and an inclination formed by side surfaces of the bank and the interlayer insulating layer is made to be gradual.

4 Claims, 9 Drawing Sheets

(56) References Cited

U.S. PATENT DOCUMENTS

| | | | |
|---|---|---|---|
| 7,045,438 B2* | 5/2006 | Yamazaki | H01L 51/529 257/E21.267 |
| 7,511,300 B2 | 3/2009 | Lee et al. | |
| 7,576,485 B2 | 8/2009 | Ohtani | |
| 7,812,799 B2* | 10/2010 | Ko | G09G 3/3233 345/690 |
| 8,415,208 B2* | 4/2013 | Takayama | H01L 21/2007 257/E21.567 |
| 8,469,551 B2* | 6/2013 | Wolk | H01L 51/5275 313/112 |
| 8,704,212 B2 | 4/2014 | Kawakami et al. | |
| 8,786,180 B2* | 7/2014 | Song | H01L 51/5246 313/504 |
| 8,853,718 B2* | 10/2014 | Lee | H01L 27/3279 257/40 |
| 9,035,854 B2* | 5/2015 | Lee | H01L 27/3279 345/80 |
| 2002/0047120 A1* | 4/2002 | Inukai | H01L 27/3262 257/59 |
| 2003/0067266 A1 | 4/2003 | Kim et al. | |
| 2005/0001963 A1 | 1/2005 | Yokoyama | |
| 2005/0077816 A1 | 4/2005 | Yamada et al. | |
| 2005/0269948 A1* | 12/2005 | Tanaka | H01L 51/5237 313/504 |
| 2007/0048886 A1 | 3/2007 | Winters et al. | |
| 2007/0098879 A1 | 5/2007 | Makiura | |
| 2007/0114519 A1 | 5/2007 | Hayashi | |
| 2007/0159043 A1 | 7/2007 | Kubota et al. | |
| 2007/0222382 A1 | 9/2007 | Yamazaki et al. | |
| 2008/0238302 A1 | 10/2008 | Sung et al. | |
| 2010/0007632 A1 | 1/2010 | Yamazaki | |
| 2010/0066240 A1 | 3/2010 | Park et al. | |
| 2010/0134426 A1* | 6/2010 | Lee | G06F 3/0412 345/173 |
| 2010/0207519 A1 | 8/2010 | Hayashi | |
| 2011/0043495 A1 | 2/2011 | Bang et al. | |
| 2012/0098421 A1 | 4/2012 | Thompson | |
| 2012/0119235 A1 | 5/2012 | Nishiyama et al. | |
| 2012/0256973 A1 | 10/2012 | Choi et al. | |
| 2012/0326194 A1 | 12/2012 | Son et al. | |
| 2014/0102366 A1 | 4/2014 | Yamazaki et al. | |
| 2014/0124771 A1 | 5/2014 | Yamazaki et al. | |
| 2014/0213798 A1 | 7/2014 | Kawakami et al. | |
| 2014/0326974 A1* | 11/2014 | Yamazaki | H01L 21/6835 257/40 |

FOREIGN PATENT DOCUMENTS

| | | |
|---|---|---|
| CN | 102738195 A | 10/2012 |
| JP | 2007234431 A | 9/2007 |
| TW | I344802 B | 7/2011 |

OTHER PUBLICATIONS

Examination Statement dated Oct. 15, 2015 from the Taiwan Advance Patent & Trademark Office in counterpart Taiwanese application No. 102141745. Note: CN 102738195A cited thereinn is already of record.

2nd Notification of Office Action from The State Intellectual Property Office of China dated Mar. 4, 2016, in counterpart Chinese application No. 201310548127.2.

* cited by examiner

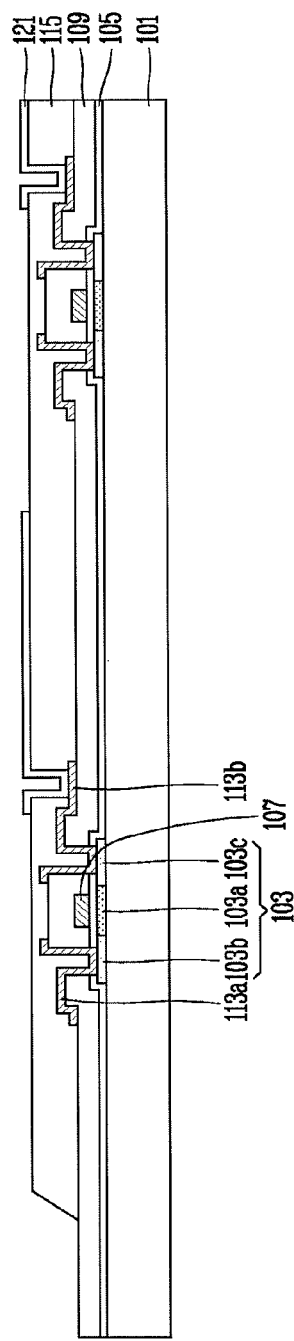
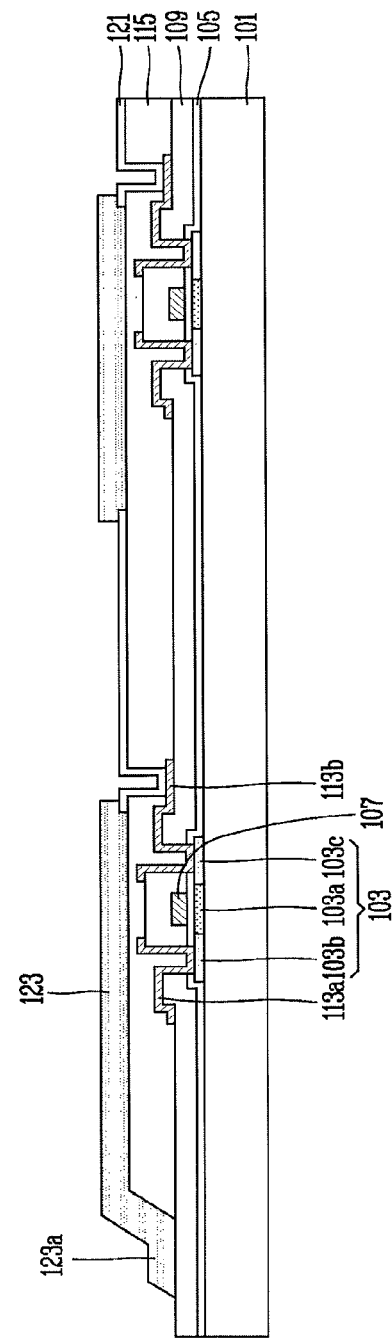

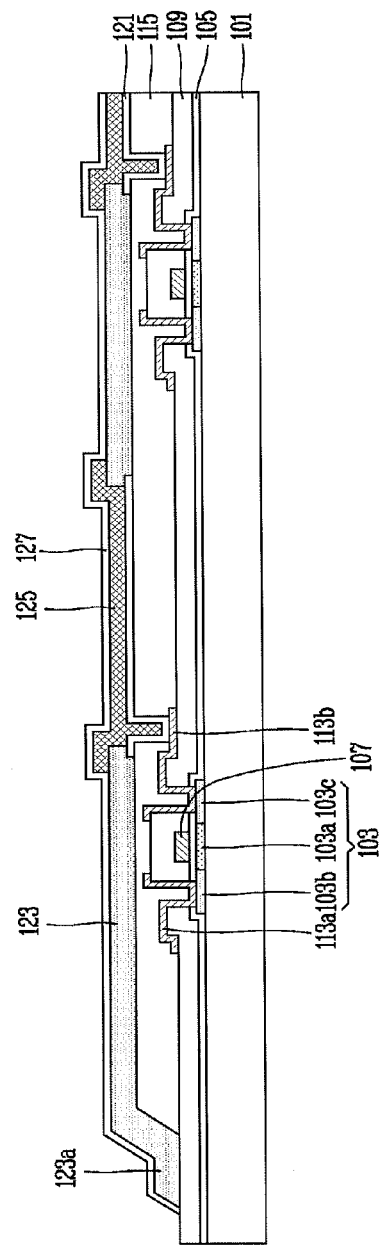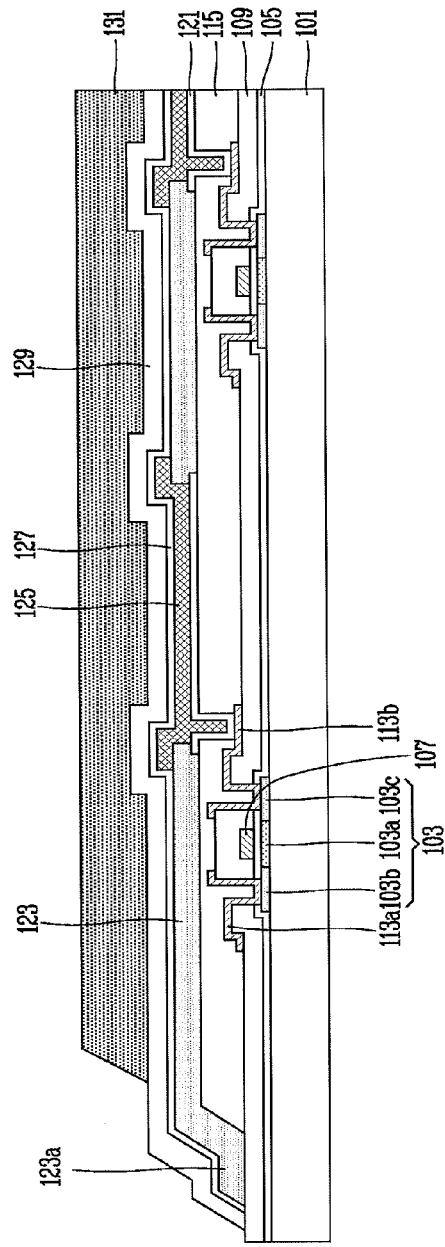

ORGANIC LIGHT-EMITTING DIODE DISPLAY PANEL

CROSS-REFERENCE TO RELATED APPLICATION

This is a divisional application of copending U.S. application Ser. No. 14/061,958, filed Oct. 24, 2013, which claims the benefit of Korean Application No. 10-2012-0131157, filed on Nov. 19, 2012, both of which are hereby incorporated by reference.

BACKGROUND OF THE DISCLOSURE

1. Field of the Disclosure

The present disclosure relates to an organic light-emitting diode (OLED) display device, and particularly, to an OLED display panel capable of minimizing degradation due to inflow of moisture thereinto, using a flexible characteristic by a plastic substrate, the degradation resulting from a large stair gap between a bank and an interlayer insulating layer.

2. Background of the Disclosure

Flat panel display devices, which have been proposed to replace the conventional cathode ray tube (CRT) display devices, may be categorized into liquid crystal displays (LCD), field emission displays (FED), plasma display panels (PDP) and organic light-emitting diode (OLED) displays, etc.

Among the flat panel display devices, the OLED display device has a characteristic that an organic light-emitting diode (EL) provided on a display panel has high brightness and a low operation voltage. Further, the OLED display device has a high contrast ratio because it is a spontaneous light-emitting type, and it can implement a display of an ultra thin thickness. The OLED display device can easily implement moving images due to a short response time corresponding to several micro seconds (μs). Besides, the OLED display device has no limitation in a viewing angle, and has a stable driving characteristic even at a low temperature.

FIG. 1 is a view illustrating an equivalent circuit with respect to one pixel of an organic light-emitting diode (OLED) display panel in accordance with the conventional art.

As shown, the OLED display panel comprises a scan line (SL), a data line (DL) crossing the scan line (SL), and a power supply line (VDDL) spaced from the scan line (SL) and the data line (DL). By the scan line (SL), the data line (DL) and the power supply line (VDDL), a single pixel (PX) is defined.

The OLED display panel further comprises a switching transistor (SWT) for applying a data signal (Vdata) to a first node (N1) in correspondence to a scan signal (Scan); a driving transistor (DT) for receiving a driving voltage (VDD) by a source electrode, and applying a drain current to an organic light-emitting diode (EL) according to a voltage difference between a gate electrode and a source electrode, the voltage difference determined by a voltage applied to the first node (N1); and a capacitor (C1) for maintaining a voltage applied to the gate electrode of the driving transistor (DT) for a single frame.

The organic light-emitting diode (EL) comprises an anode connected to a drain electrode of the driving transistor (DT), a cathode which is grounded (VSS), and an organic light-emitting layer formed between the anode and the cathode. The organic light-emitting layer may be composed of a hole transporting layer, an emitting material layer, and an electron transporting layer.

FIG. 2A is a view schematically illustrating a structure of an OLED display panel in accordance with the conventional art, and FIG. 2B is a sectional view taken along line 'II-II' in FIG. 2A.

Referring to FIGS. 2A and 2B, the conventional OLED display panel has a active area (A/A) formed on a substrate 10, and a non-active area (N/A) formed outside the active area (A/A). A plurality of pixel regions (PX) defined by scan lines (SL) and data lines (DL) are provided in the display active area (A/A), and power supply lines (VDDL) are provided in parallel to the data lines (DL).

Especially, the non-active area (N/A) of the OLED display panel has a multi-layered structure extending from the active area (A/A). A gate insulating layer 15, an insulating layer 19, an interlayer insulating layer 25, a bank 33, a first passivation layer 39, an adhesive layer 41, and a barrier film 50 are sequentially formed on a substrate 11, in at least the non-active area (N/A).

Such structure is called 'face seal' structure. In the lamination structure of the passivation layer 39, the adhesive layer 41 and the barrier film 50, the passivation layer 39 and the barrier film 50 serve as a barrier which prevents moisture permeability into the OLED display panel. However, the adhesive layer 41 does not serve well as a barrier, resulting in introduction of water from the side surface of the OLED display panel.

In the face seal structure, the side surface of the OLED display panel, formed by the interlayer insulating layer 25 and the bank 33, has a wide inclination angle. Due to such wide inclination angle, the foreign materials (DP) remain at the side surface of the OLED display panel without being removed, during fabrication processes. This may cause water to be introduced into the OLED display panel from outside.

Water (W), which has been introduced through the adhesive layer 41 having a low barrier function, is firstly introduced into the OLED display panel through a contact part between foreign materials and the OLED display panel. Then, the water is secondarily introduced into the OLED display panel through a bank, a planarization layer, etc. This may cause the cathode of the organic light-emitting diode (EL), thereby degrading reliability of the OLED display panel.

SUMMARY OF THE DISCLOSURE

Therefore, an aspect of the detailed description is to provide an organic light-emitting diode (OLED) display panel capable of preventing degradation due to inflow of moisture thereinto, using a flexible characteristic by a plastic substrate, the degradation resulting from a large stair gap between a bank and an interlayer insulating layer, and a method for fabricating the same.

To achieve these and other advantages and in accordance with the purpose of this specification, as embodied and broadly described herein, there is provided an organic light-emitting diode (OLED) display panel according to a first embodiment, comprising: a substrate divided into a display region which defines a plurality of pixels, and a non-display region formed to enclose the display region; a plurality of signal lines and a thin film transistor formed on the substrate; an interlayer insulating layer formed on the substrate including the thin film transistor, and configured to expose one electrode of the thin film transistor to outside; a first electrode formed on the interlayer insulating layer, and connected to said one electrode; a bank extending up to the non-display region on the substrate including the first electrode, and completely covering the interlayer insulating layer; an organic light-emitting layer formed on the first electrode in each pixel; a second electrode on the organic light-emitting layer in an entire part of the display region; a first passivation layer formed on an entire surface of the substrate including the second electrode; an organic layer formed on the first passivation layer; a second passivation layer formed on the first passivation layer including the organic layer; a barrier film disposed to face the substrate; and an adhesive interposed between the substrate and the barrier film, and configured to adhere the substrate and the barrier film to each other.

To achieve these and other advantages and in accordance with the purpose of this specification, as embodied and broadly described herein, there is also provided an organic light-emitting diode (OLED) display panel according to a first embodiment, comprising: a substrate divided into a display region which defines a plurality of pixels, and a non-display region formed to enclose the display region; a plurality of signal lines and a thin film transistor formed on the substrate; an interlayer insulating layer formed on the substrate including the thin film transistor, configured to expose one electrode of the thin film transistor to outside, and extending up to the non-display region; a first electrode formed on the interlayer insulating layer, and connected to said one electrode; a bank formed on the substrate including the first electrode such that a side surface of the interlayer insulating layer is exposed; an organic light-emitting layer formed on the first electrode in each pixel; a second electrode on the organic light-emitting layer in an entire part of the display region; a first passivation layer formed on an entire surface of the substrate including the second electrode; an organic layer formed on the first passivation layer; a second passivation layer formed on the first passivation layer including the organic layer; a barrier film disposed to face the substrate; and an adhesive interposed between the substrate and the barrier film, and configured to adhere the substrate and the barrier film to each other.

The interlayer insulating layer and the bank may be formed such that side surfaces thereof form a stair shape.

The first passivation layer may be formed to completely cover the interlayer insulating layer and the bank.

The substrate may be formed of a plastic material having a flexible characteristic.

To achieve these and other advantages and in accordance with the purpose of this specification, as embodied and broadly described herein, there is also provided a method for fabricating an organic light-emitting diode (OLED) display panel according to a first embodiment, the method comprising: providing a substrate divided into a display region which defines a plurality of pixels, and a non-display region formed to enclose the display region; forming, on the substrate, a plurality of signal lines and a thin film transistor; forming, on the substrate including the thin film transistor, an interlayer insulating layer configured to expose one electrode of the thin film transistor to outside; forming, on the interlayer insulating layer, a first electrode connected to said one electrode; forming, on the substrate including the first electrode, a bank extending up to the non-display region to thus completely cover the interlayer insulating layer; forming, on the first electrode, an organic light-emitting layer in each pixel; forming a second electrode on the organic light-emitting layer, in an entire part of the display region; forming a first passivation layer on an entire surface of the substrate including the second electrode; forming an organic layer on the first passivation layer; forming a second passivation layer on the first passivation layer including the organic layer; and attaching the substrate to a barrier film using an adhesive.

To achieve these and other advantages and in accordance with the purpose of this specification, as embodied and broadly described herein, there is also provided a method for fabricating an organic light-emitting diode (OLED) display panel according to a second embodiment, the method comprising: providing a substrate divided into a display region which defines a plurality of pixels, and a non-display region formed to enclose the display region; forming, on the substrate, a plurality of signal lines and a thin film transistor; forming, on the substrate including the thin film transistor, an interlayer insulating layer so as to extend up to the non-display region and to expose one electrode of the thin film transistor to outside; forming, on the interlayer insulating layer, a first electrode connected to said one electrode; forming, on the substrate including the first electrode, a bank so that a side surface of the interlayer insulating layer is exposed to outside; forming, on the first electrode, an organic light-emitting layer in each pixel; forming a second electrode on the organic light-emitting layer, in an entire part of the display region; forming a first passivation layer on an entire surface of the substrate including the second electrode; forming an organic layer on the first passivation layer; forming a second passivation layer on the first passivation layer including the organic layer; and attaching the substrate to a barrier film using an adhesive.

The interlayer insulating layer and the bank may be formed such that side surfaces thereof form a stair shape.

In the step of forming a first passivation layer, the first passivation layer may be formed to completely cover the interlayer insulating layer and the bank.

The substrate may be formed of a plastic material having a flexible characteristic.

In the present invention according to the present invention, the interlayer insulating layer and the bank may be formed on the substrate such that one of them has a greater width than the other. As an inclination angle formed by the side surfaces of the interlayer insulating layer and the bank is made to be gradual, foreign materials can be easily removed from the side surfaces. This can solve the conventional problem due to introduction of water into the OLED display panel.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIGS. 5A to 5G are sectional views schematically illustrating a method for fabricating an OLED display panel according to the present invention.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, an organic light-emitting diode display panel according to preferred embodiments of the present invention will be explained in more detail with reference to the attached drawings.

Generally, an organic light-emitting diode (OLED) display panel is categorized into a top emission type and a bottom emission type according to a transmission direction of emitted light. Hereinafter, a top emission type OLED display panel will be explained.

Figure 1:
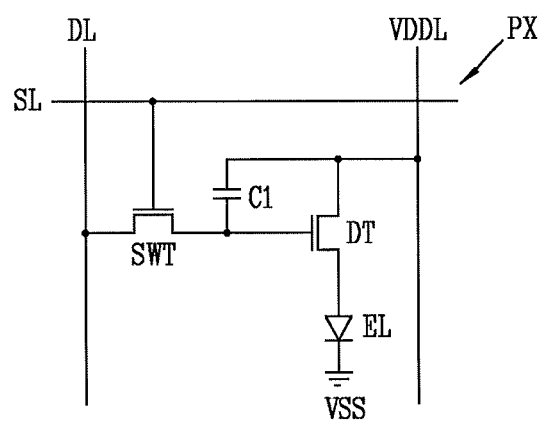
FIG. 1 is a view illustrating an equivalent circuit with respect to one pixel of an organic light-emitting diode (OLED) display panel in accordance with the conventional art.
Figure 2A:
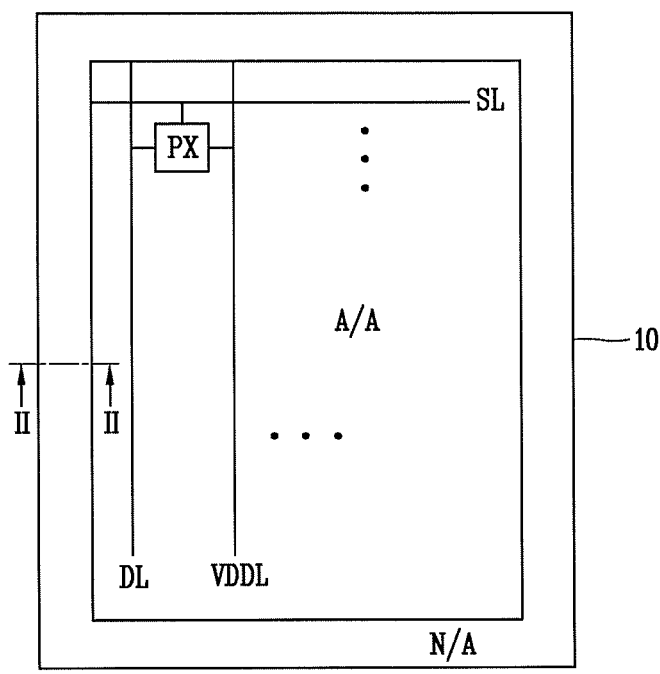
FIG. 2A is a view schematically illustrating a structure of an OLED display panel in accordance with the conventional art.
Figure 2B:
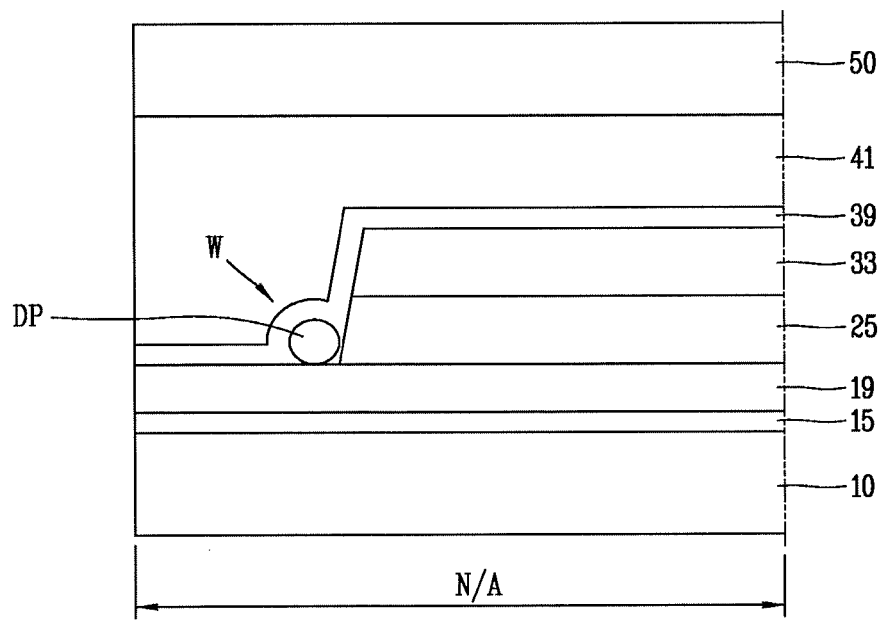
FIG. 2B is a sectional view taken along line 'II-II' in FIG. 2A.
Figure 3:
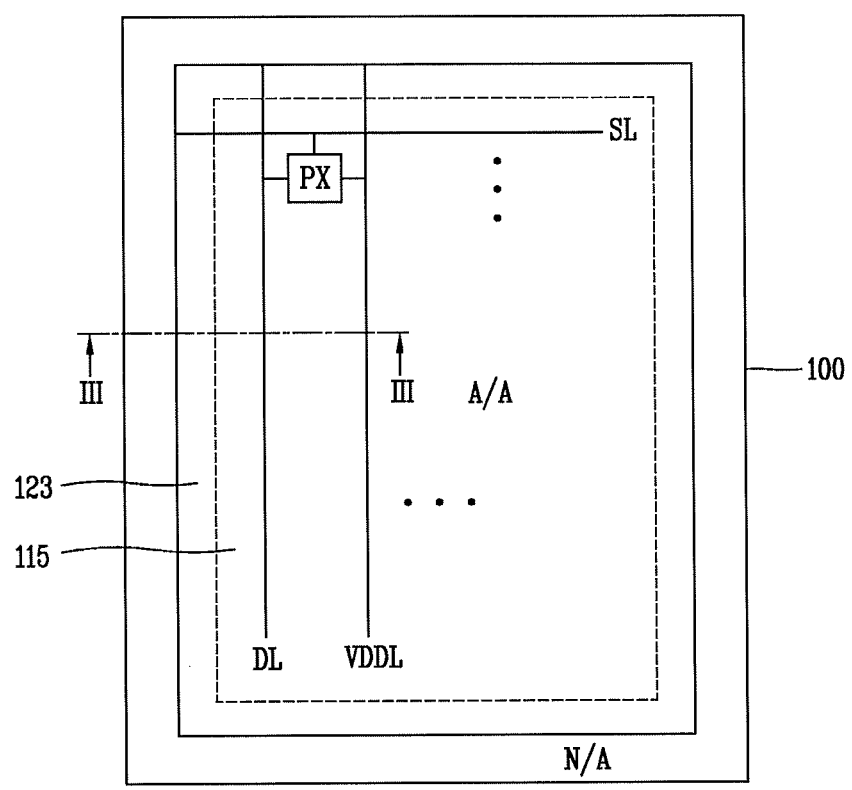
FIG. 3 is a planar view schematically illustrating an OLED display panel according to a first embodiment of the present invention.
Figure 4:
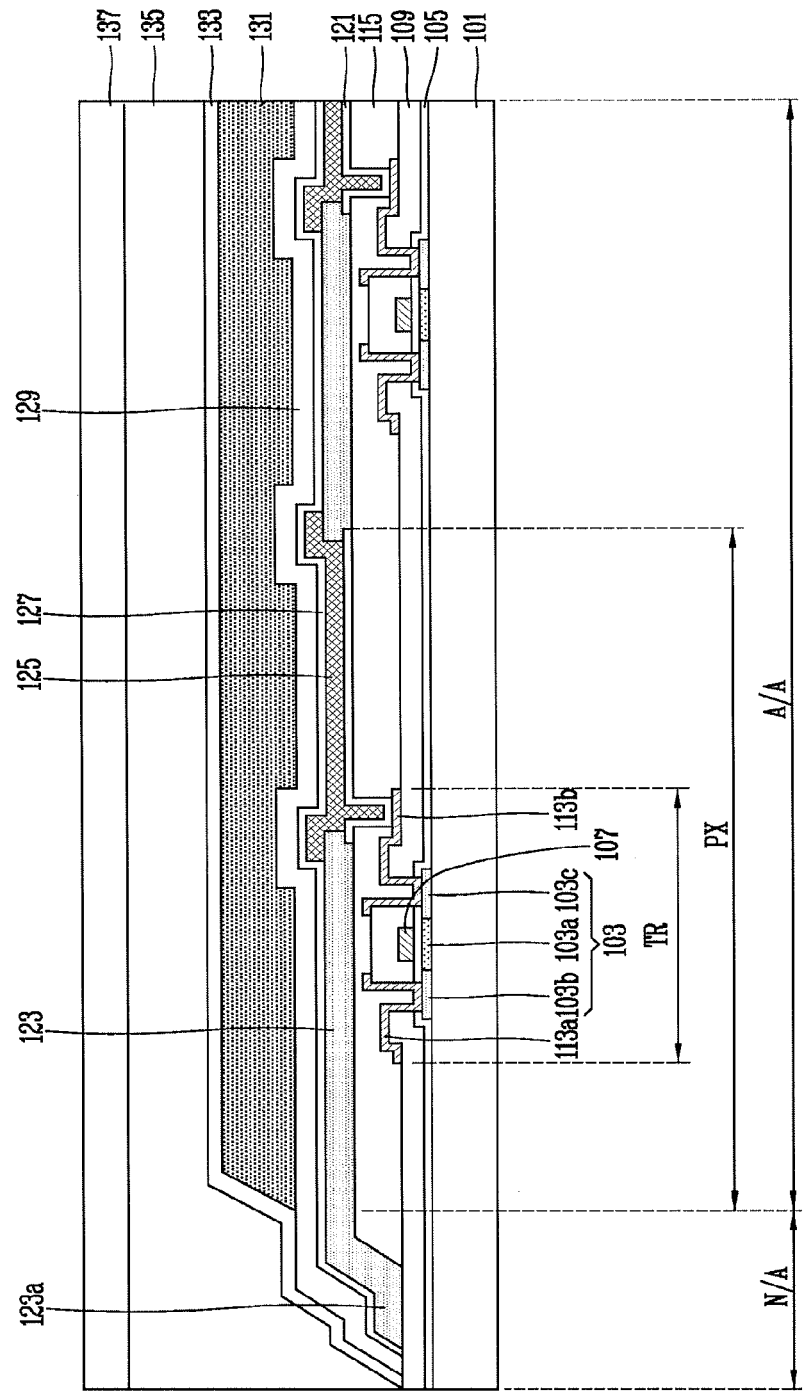
FIG. 4 is a sectional view taken along line 'III-III' in FIG. 3.

FIG. 3 is a planar view schematically illustrating an OLED display panel according to a first embodiment of the present invention, and FIG. 4 is a sectional view taken along line 'III-III' in FIG. 3.

Referring to FIGS. 3 and 4, an organic light-emitting diode (OLED) display panel according to the present invention is divided into an active area (A/A) for displaying an image on a substrate 101 having a flexible characteristic, and a non-active area (N/A) formed to surround the active area (A/A). A plurality of pixels (PX) defined by a plurality of scan lines (SL) and data lines (DL) are included at the active area (A/A). Power supply lines (VDDL) are included in parallel to the data lines (DL). Although not shown, a driver (not shown), electrically connected to the pixels (PX) and providing various types of signals to the OLED display panel, may be mounted to one side of the non-active area (N/A).

The substrate 101 may be formed of a plastic material having a flexible characteristic so that the OLED display panel can maintain a display performance even when rolled up like paper.

A buffer layer (not shown), made of an insulating material, e.g., an inorganic insulating material such as silicon dioxide ($SiO_2$) or silicon nitride (SiNx), may be formed on the substrate 100. Such buffer layer may serve to minimize degradation of a semiconductor layer 103 formed thereon, resulting from emission of alkaline icons from inside of the substrate 101, when the semiconductor layer 103 is crystallized during the subsequent process.

Each pixel (PX) inside the active area (A/A) above the buffer layer (not shown) includes at least one switching thin film transistor and at least one driving thin film transistor (TR) for controlling an organic light-emitting diode. The semiconductor layer 103 is formed in correspondence to each thin film transistor. The semiconductor layer 103 is composed of a first region 103a formed of pure poly silicon, and second regions 103b and 103c formed at two sides of the first region 103a. The first region 103a forms a channel at a central part of the semiconductor layer 103, and the second regions 103b and 103c are doped with impurities of high concentration.

A gate insulating layer 105 is formed on the buffer layer including the semiconductor layer 103. And a gate electrode 107, which corresponds to the first region 103a of the semiconductor layer 103 in each thin film transistor (TR), is formed on the gate insulating layer 105.

A scan lines (SL), connected to the gate electrode 107 of a switching thin film transistor (not shown) and extending in one direction, is formed on the gate insulating layer 105. The gate electrode 107 and the scan lines (SL) may have a single-layered structure by being formed of a first metallic material having a low resistance, e.g., one of aluminum (Al), aluminum alloy (AlNd), copper (Cu), copper alloy, molybdenum (Mo) and molybdenum titanium (MoTi). Alternatively, the gate electrode 107 and the scan lines (SL) may have a double-layered or three-layered structure by being formed of two or more first metallic materials. In drawings, the gate electrode 107 and the scan lines (SL) have a single-layered structure.

An insulating layer 109, made of an insulating material, e.g., an inorganic insulating material such as silicon dioxide ($SiO_2$) or silicon nitride (SiNx), may be formed on the entire surface of the active area (A/A) of the substrate 101 including the gate electrode 107 and the scan lines (SL). Semiconductor layer contact holes (not shown), through which the second regions 103b and 103c disposed at two sides of the first region 103a of the semiconductor layer 103 are exposed to outside, are provided at the insulating layer 109 and the gate insulating layer 105 disposed below the insulting layer 109.

Data lines (DL) which define pixels (PX) by crossing the scan lines (SL), and power supply lines (VDDL) spaced from the data lines (DL) are formed on the insulating layer 109 including the semiconductor layer contact holes (not shown). The data lines (DL) and the power supply lines (VDDL) may be formed of a second metallic material, e.g., one of aluminum (Al), aluminum alloy (AlNd), copper (Cu), copper alloy, molybdenum (Mo), molybdenum titanium (MoTi), chrome (Cr) and titanium (Ti), or a combination of at least two of them.

The power supply lines (VDDL) may be formed to be spaced from the scan lines (SL) in parallel to the scan lines (SL), on the gate insulating layer 105 where the scan lines (SL) have been formed.

A source electrode 113a and a drain electrode 113b, formed of the second metallic material, the same material as the data lines (DL), and contacting the second regions 103b and 103c exposed to outside through the semiconductor layer contact holes (not shown), are spaced from each other. The source electrode 113a and the drain electrode 113b are formed on the insulating layer 109, at each of a switching thin film transistor and a driving thin film transistor. The driving thin film transistor (TR) is formed by the semiconductor layer 103, the gate insulating layer 105, the gate electrode 107 and the insulating layer 109 sequentially laminated on each other, and the source electrode 113a and the drain electrode 113b spaced from each other.

In drawings, all of the data lines (DL), the source electrode 113a and the drain electrode 113b have a single-layered structure. However, the data lines (DL), the source electrode 113a and the drain electrode 113b may have a double-layered or three-layered structure as two metallic materials are combined with each other.

Although not shown, each pixel includes a driving thin film transistor, and a switching thin film transistor (not shown) having the same lamination structure as the driving thin film transistor. The switching thin film transistor (not shown) is electrically connected to the driving thin film transistor (TR), the scan line (SL) and the data line (DL). That is, the scan line (SL) and the data line (DL) are connected to a gate electrode and a source electrode of the switching thin film transistor, respectively. And a drain electrode of the switching thin film transistor is electrically connected to the gate electrode 107 of the driving thin film transistor (TR).

In drawings, the driving thin film transistor (TR) is configured as a top gate type having the semiconductor layer 103 formed of poly silicon. However, the driving thin film transistor (TR) may be configured as a bottom gate type having a semiconductor layer formed of amorphous silicon. In this case, the aforementioned switching thin film transistor has the same active layer as the driving thin film transistor (TR).

In a case where the driving thin film transistor (TR) is configured as a bottom gate type, the TR may have a lamination structure of a gate electrode/a gate insulating layer/a semiconductor layer composed of one active layer formed of pure amorphous silicon, and two ohmic contact layers formed of impurity amorphous silicon and disposed at two sides of the active layer/and a source electrode and a drain electrode spaced from each other.

An interlayer insulating layer 115 having a drain contact hole (not shown), through which the drain electrode 113b of the driving thin film transistor (TR) is exposed to outside, is formed on the driving thin film transistor (TR) and the switching thin film transistor. As the interlayer insulating layer 115, may be used an inorganic insulating material such as silicon dioxide ($SiO_2$) or silicon nitride (SiNx).

In the preferred embodiments of the present invention, the interlayer insulating layer 115 extends from the pixel (PX) and the active area (A/A) to the non-active area (N/A). In this case, a width of the interlayer insulating layer 115 toward the non-active area (N/A) is narrower than that of a bank 123 to be explained later.

A first electrode 121, connected to the drain electrode 113c of the driving thin film transistor (TR) through a drain contact hole (not shown), is formed on the interlayer insulating layer 115.

Banks 123 and 123a, formed of an insulating material, such as benzocyclobutene (BCB), polyimide or photo acryl, extend on the first electrode 121, up to a boundary between pixels (PXs) and the non-active area (N/A). The central bank 123 is formed to overlap the edge of the first electrode 121 and to enclose each pixel (PX). The central bank 123 is in a lattice shape having a plurality of openings, on the entire surface of the active area (A/A). The outer bank 123a is formed on the entire surface of the non-active area (N/A), at an edge region of the OLED display panel, in a form to completely cover the interlayer insulating layer 115 of the non-active area (N/A).

As the bank 123a extends to cover the interlayer insulating layer 115, the side surfaces of the interlayer insulating layer 115 and the bank 123a form a stair shape and a gradual inclination angle. As a result, foreign materials introduced into the side surfaces from outside can be easily removed.

An organic light-emitting layer 125, made of organic light-emitting patterns (not shown) which emit red, green and blue light, is formed on the first electrode 121 enclosed by the banks 123 and 123a in each pixel (PX). The organic light-emitting layer 125 may be configured as a single layer formed of an organic light-emitting material. Although not shown, for enhanced light-emitting efficiency, the organic light-emitting layer 125 may be configured as a multi-layer formed of a hole injection layer, a hole transporting layer, an emitting material layer, an electron transporting layer and an electron injection layer.

A second electrode 127 is formed on the organic light-emitting layer 125 and the banks 123 and 123a, on the entire surface of the active area (A/A). The first electrode 121, the second electrode 127, and the organic light-emitting layer 125 interposed between the first electrode 121 and the second electrode 127, form an organic light-emitting diode (OLED) (EL).

In the OLED (EL), once a prescribed voltage is applied to the first electrode 121 and the second electrode 127 according to a selected color signal, a hole injected from the first electrode 121 and an electron provided from the second electrode 127 are transferred to the organic light-emitting layer 125 to thus form exciton. When the exciton is transited from an excited state to a ground state, light is generated to be emitted in the form of visible rays. Since the generated light is emitted to outside through the transparent second electrode 127, the flexible organic light-emitting diode display panel implements any images.

A first passivation layer 129 formed of an insulating material, especially, an inorganic insulating material such as silicon dioxide ($SiO_2$) or silicon nitride (SiNx), is formed on the entire surface of the substrate 100 including the second electrode 127. There is a limitation to prevent water from being introduced to the organic light-emitting layer 125, using only the second electrode 127. Accordingly, the first passivation layer 129 is formed on the second electrode 127, so that introduction of water to the organic light-emitting layer 125 can be prevented more easily.

An organic layer 131, made of an organic material such as polymer, is formed on the active area (A/A) on the first passivation layer 129. As the polymer of the organic layer 131, may be used olefine-based polymer (polyethylene, polypropylene), polyethylene terephthalate (PET), epoxy resin, fluoro resin, polysiloxane, etc. The first passivation layer 129 is formed so that its side surface can have a gradual inclination angle, and it extends up to the non-active area (N/A).

A second passivation layer 133 made of an insulating material, for example, an inorganic insulating material such as silicon dioxide ($SiO_2$) or silicon nitride (SiNx), is formed on the entire surface of the substrate 100 including the organic layer 131, in order to prevent introduction of water into the OLED display panel through the organic layer 131. The second passivation layer 133 is configured to effectively prevent inflow of moisture on the non-active area (N/A), by covering not only the end of the organic layer 131, but also the first passivation layer 129 formed therebelow and the outer bank 123a.

A barrier film 137 is positioned on the entire surface of the substrate 101 including the second passivation layer 133 in a facing manner, for encapsulation of an organic light-emitting diode. An adhesive layer 135 is interposed between the substrate 101 and the barrier film 137, without an air layer, in a completely sealed state. The adhesive layer 135 is formed of one of frit having an adhesion property, an organic insulating material and a polymer material. In the present invention, the adhesive layer 135 may be configured as a press sensitive adhesive (PSA).

As the substrate 101 and the barrier film 137 are attached to each other by the adhesive 135 to thus form a panel, an organic light-emitting diode display panel according to the present invention is implemented.

In the organic light-emitting diode display panel according to the first embodiment of the present invention, the bank on the active area (A/A) is formed to have a greater width than the interlayer insulating layer, so that the bank can completely cover the interlayer insulating layer formed therebelow. As an inclination angle formed by side surfaces of the interlayer insulating layer and the bank is made to be gradual at an edge region of the OLED display panel, foreign materials introduced into the side surfaces can be easily removed during fabrication processes. This can enhance reliability of the OLED display panel.

Hereinafter, a method for fabricating an organic light-emitting diode display panel according to a first embodiment of the present invention will be explained in more detail with reference to FIGS. 5A to 5G.

FIGS. 5A to 5G are sectional views schematically illustrating a method for fabricating an OLED display panel according to the present invention.

Figure 5A:
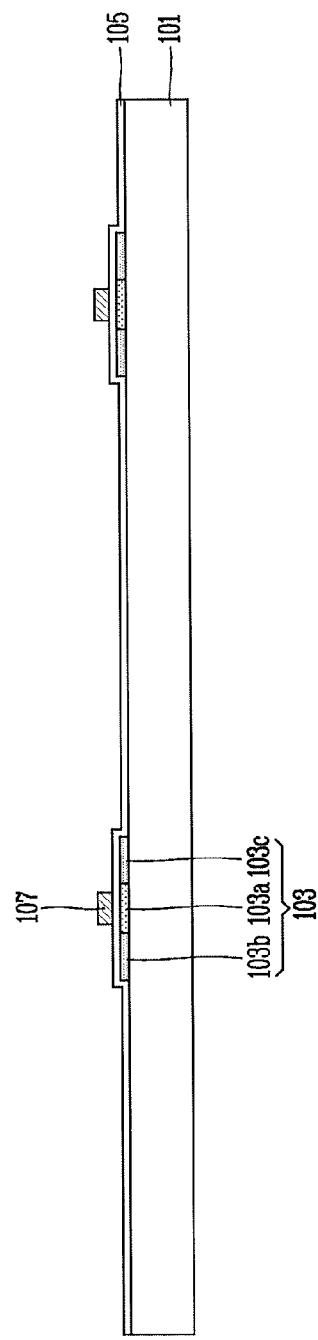

As shown in FIG. 5A, prepared is a substrate 101 having a flexible characteristic, and divided into an active area (A/A) and a non-active area (N/A) formed outside the active area (A/A). The flexible substrate 101 is formed of a plastic material having a flexible characteristic so that the OLED display panel can maintain a display performance even when bent.

A buffer layer (not shown), made of an insulating material, e.g., an inorganic insulating material such as silicon dioxide ($SiO_2$) or silicon nitride (SiNx), is formed on the substrate 101. Such buffer layer may be omitted according to characteristics of the substrate formed therebelow and a semiconductor layer (not shown) formed thereon.

Each pixel (PX) on the buffer layer (not shown) in the active area (A/A) includes a switching thin film transistor and a driving thin film transistor (not shown). A semiconductor layer 103 is formed in correspondence to the switching thin film transistor and the driving thin film transistor. The semiconductor layer 103 is composed of a first region 103a formed of pure poly silicon, and second regions 103b and 103c formed at two sides of the first region 103a. The first region 103a forms a channel at a central part of the semiconductor layer 103, and the second regions 103b and 103c are doped with impurities of high concentration.

A gate insulating layer 105 is formed on the buffer layer including the semiconductor layer 103. And a gate electrode 107, which corresponds to the first region 103a of the semiconductor layer 103, is formed on the gate insulating layer 105.

A gate line (not shown), connected to the gate electrode 107 of the switching region (not shown) and extending in one direction, is formed on the gate insulating layer 105. The gate electrode 107 and the gate lines (not shown) may have a single-layered structure by being formed of a first metallic material having a low resistance, e.g., one of aluminum (Al), aluminum alloy (AlNd), copper (Cu), copper alloy, molybdenum (Mo) and molybdenum titanium (MoTi). Alternatively, the gate electrode 107 and the gate lines (not shown) may have a double-layered or three-layered structure by being formed of two or more first metallic materials. In drawings, the gate electrode 107 and the gate lines (not shown) have a single-layered structure.

Figure 5B:
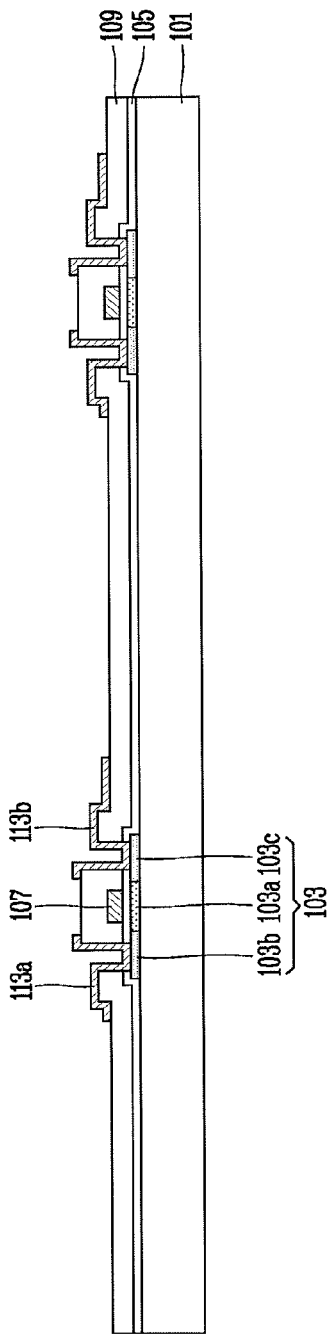

As shown in FIG. 5B, an interlayer insulating layer 109 made of an insulating material, for example, an inorganic insulating material such as silicon dioxide ($SiO_2$) or silicon nitride (SiNx), is formed on the gate electrode 107 and the gate lines (not shown), on the entire surface of the active area (A/A).

Then, the interlayer insulating layer 109 and the gate insulating layer 105 formed therebelow are selectively patterned, thereby forming contact holes (not shown) through which the second regions 103b and 103c disposed at two sides of the first region 103a of the semiconductor layer 103 are exposed to outside.

As shown in FIG. 5C, a second metallic material layer (not shown) is formed on the interlayer insulting layer 109 including the contact holes (not shown). The second metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them.

Then, the second metallic material layer is selectively patterned to form data lines (not shown) and power supply lines (not shown). The data lines define pixels (PX) by crossing the gate lines, and the power supply lines are spaced from the data lines. The power supply lines (not shown) may be formed on the gate insulating layer 105, not the interlayer insulting layer 109, in parallel to the gate lines in a spaced manner therefrom.

A source electrode 113a and a drain electrode 113b, made of the same second metallic material as the data lines (not shown), are formed on the interlayer insulating layer 109, simultaneously when the data lines (not shown) are formed. The source electrode 113a and the drain electrode 113b are spaced from each other on each driving transistor region (not shown) and each switching transistor region (not shown), and contact the second regions 103b and 103c exposed to outside through contact holes. Under such configuration, the semiconductor layer 103, the gate insulating layer 105, the gate electrode 107 and the interlayer insulating layer 109 sequentially deposited on the driving transistor region, form a driving thin film transistor, together with the source electrode 113a and the drain electrode 113b which are spaced from each other.

In drawings, all of the data lines, the source electrode 113a and the drain electrode 113b have a single-layered structure. However, the source electrode 113a and the drain electrode 113b may have a double-layered structure or a three-layered structure in which two different metallic materials are combined with each other.

Although not shown, the switching thin film transistor, which has the same lamination structure as the driving thin film transistor, is electrically connected to the driving thin film transistor, a gate line (not shown) and a data line (not shown). That is, a gate line (not shown) and a data line (not shown) are connected to a to gate electrode and a source electrode of a switching thin film transistor. And a drain electrode (not shown) of the switching thin film transistor is electrically connected to the gate electrode 107 of the driving thin film transistor.

In this embodiment, the driving thin film transistor and the switching thin film transistor (not shown) have the semiconductor layer 103 formed of poly silicon, and are configured as a top gate type. However, the driving thin film transistor and the switching thin film transistor may be configured as a bottom gate type. In this case, unlike in the drawings, the driving thin film transistor and the switching thin film transistor may have a lamination structure of a gate electrode/a gate insulating layer/a semiconductor layer composed of one active layer formed of pure amorphous silicon, and two ohmic layers formed of impurity amorphous silicon and formed at two sides of the active layer/and a source electrode and a drain electrode spaced from each other.

Next, an interlayer insulating layer 115 is formed on the driving thin film transistor and the switching thin film transistor. The interlayer insulating layer 115 may be formed of an insulating layer, e.g., an inorganic insulating material such as silicon dioxide ($SiO_2$) or silicon nitride (SiNx).

Then, the interlayer insulating layer 115 is selectively patterned to form a contact hole through which a drain electrode 113c of the driving thin film transistor is exposed to outside.

A third metallic material layer (not shown) is deposited on the interlayer insulating layer 115, and then is selectively patterned to form a first electrode 121. The first electrode 121 comes in contact with the drain electrode 113c of the driving thin film transistor through the contact hole, and is formed in each pixel (PX). The third metallic material layer (not shown) may be formed of aluminum (Al), aluminum alloy (AlNd), copper (Cu), copper alloy, molybdenum (Mo), molybdenum titanium (MoTi), chrome (Cr) and titanium (Ti), or a combination of at least two of them.

Although not shown, an insulating material layer (not shown), formed of benzocyclobutene (BCB), polyimide or photo acryl, is formed on the first electrode 121, on the entire surface of the substrate 101.

As shown in FIG. 5D, the insulating material layer (not shown) is selectively patterned to form banks 123 and 123a. The bank 123 is formed to overlap the edge of the first electrode 121 with enclosing each pixel (PX), and has a lattice shape having a plurality of openings in the entire active area (A/A). The outer bank 123a is formed to extend up to the non-active area (N/A) at an edge region of the OLED display panel. The outer bank 123a is formed to have a greater width than the interlayer insulating layer 115 formed therebelow, thereby completely covering the interlayer insulating layer 115. Also, the outer bank 123a is formed to have a gradual side surface.

As shown in FIG. 5E, an organic light-emitting layer 125, composed of organic light-emitting patterns (not shown) for emitting red, green and blue light, is formed on the first electrode 121 enclosed by the banks 123 and 123a in each pixel (PX). The organic light-emitting layer 125 may be configured as a single layer formed of an organic light-emitting material. Although not shown, for enhanced light-emitting efficiency, the organic light-emitting layer 125 may be configured as multi layers of a hole injection layer, a hole transporting layer, an emitting material layer, an electron transporting layer and an electron injection layer.

Then, a second electrode 127 is formed on the active area (A/A) including the organic light-emitting layer 125 and the banks 123 and 123a. The second electrode 127 may be formed of a transparent conductive material, e.g., at least one of a conductive material including ITO and a conductive material including IZO. Under such configuration, the first electrode 121, the second electrode 127, and the organic light-emitting layer 125 interposed between the first electrode 121 and the second electrode 127 form an organic light-emitting diode (OLED).

In the OLED, once a prescribed voltage is applied to the first electrode 121 and the second electrode 127 according to a selected color signal, a hole injected from the first electrode 121 and an electron provided from the second electrode 127 are transferred to the organic light-emitting layer 125 to thus form exciton. When the exciton is transited from an excited state to a ground state, light is generated to be emitted in the form of visible rays. Since the generated light is emitted to outside through the transparent second electrode 127, each pixel (PX) of the OLED display panel implements a gradation (gray scale) of a corresponding image.

As shown in FIG. 5F, a first passivation layer 129, made of an insulating material, e.g., an inorganic insulating material such as silicon dioxide ($SiO_2$) or silicon nitride (SiNx), is formed on the entire surface of the substrate 100 including the second electrode 127. The second electrode 127 alone cannot prevent introduction of water into the organic light-emitting layer 125. Accordingly, the first passivation layer 129 is formed on the second electrode 127 to completely prevent introduction of water into the organic light-emitting layer 125.

Then, an organic layer 131, made of an organic material such as polymer, is formed on the active area (A/A) and the non-active area (N/A) on the first passivation layer 129, using a deposition method such as a screen printing method. As the polymer of the organic layer 131, may be used olefine-based polymer (polyethylene, polypropylene), polyethylene terephthalate (PET), epoxy resin, fluoro resin, polysiloxane, etc. The organic layer 131 may be formed to extend up to the non-active area (N/A) from the active area (A/A).

Figure 5G:
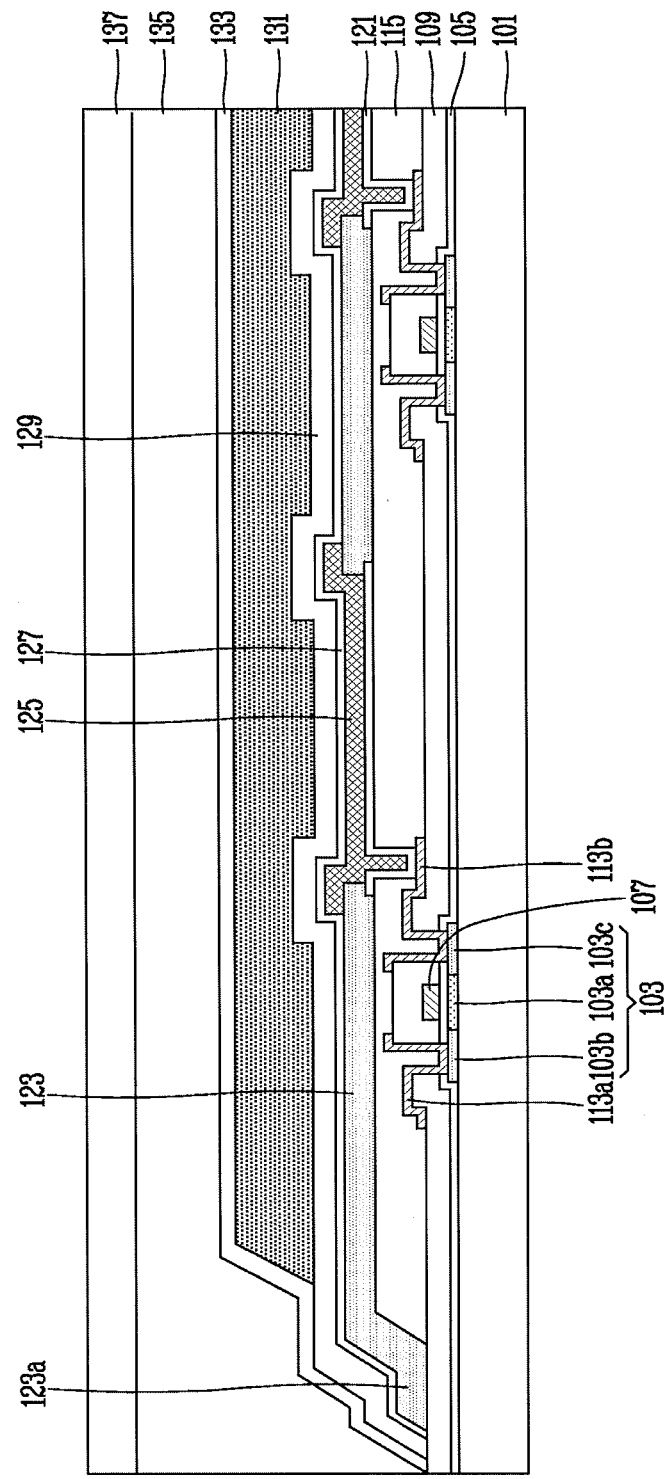

As shown in FIG. 5G, for prevention of inflow of moisture into the OLED display panel, a second passivation layer 133, which is made of an insulating material, e.g., an inorganic insulating material such as silicon dioxide ($SiO_2$) or silicon nitride (SiNx), is further formed on the entire surface of the substrate 101 including the organic layer 131.

A barrier film 137 is positioned on the entire surface of the substrate 101 including the second passivation layer 133 in a facing manner, for encapsulation of an organic light-emitting diode (EL). An adhesive layer 135 is interposed between the substrate 101 and the barrier film 137, without an air layer, in a completely sealed state. The adhesive layer 135 is formed of one of frit having an adhesion property, an organic insulating material and a polymer material. As the substrate 101 and the barrier film 137 are attached to each other by the adhesive layer 135 to thus form a panel, an organic light-emitting diode display panel according to the present invention is implemented.

In the OLED display panel according to the first embodiment of the present invention.

The bank on the active area (A/A) may be formed to have a greater width than the interlayer insulating layer, so that the bank can completely cover the interlayer insulating layer formed therebelow. As an inclination angle formed by side surfaces of the interlayer insulating layer and the bank is made to be gradual at an edge region of the OLED display panel, foreign materials introduced into the side surfaces can be easily removed during fabrication processes. This can enhance reliability of the OLED display panel. Hereinafter, an organic light-emitting diode (OLED) display panel according to a second embodiment of the present invention will be explained with reference to the attached drawings.

Figure 6:
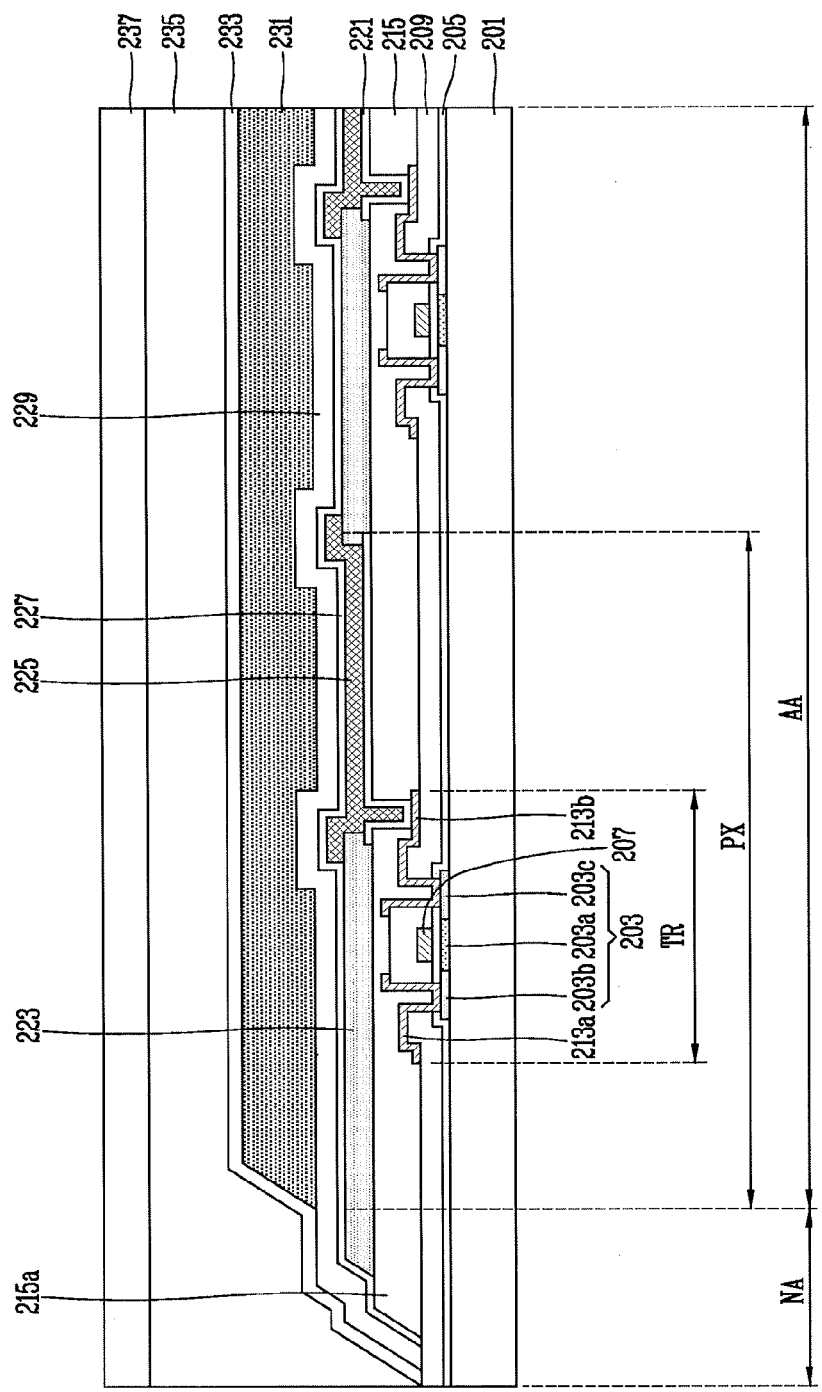
FIG. 6 is a sectional view of an OLED display panel according to a second embodiment of the present invention.

FIG. 6 is a sectional view of an OLED display panel according to a second embodiment of the present invention. Like in the first embodiment, in the second embodiment, the interlayer insulating layer and the bank are configured so that an inclination angle formed by the side surfaces thereof can be gradual. However, the second embodiment is different from the first embodiment in that the interlayer insulating layer has a greater width than the bank.

Referring to FIG. 6, in an OLED display panel according to the present invention, an active area (A/A) for displaying an image, and a non-display region (N/A) formed to enclose the active area (A/A) are defined on a substrate 201 having a flexible characteristic.

A buffer layer (not shown), made of an insulating material, e.g., an inorganic insulating material such as silicon dioxide ($SiO_2$) or silicon nitride (SiNx), may be formed on the substrate 201. A switching thin film transistor and a driving thin film transistor (TR) are formed at each pixel (PX) inside the active area (A/A) above the buffer layer (not shown). A semiconductor layer 203 is formed in correspondence to each thin film transistor (TR). The semiconductor layer 203 is composed of a first region 203a and second regions 203b and 203c formed at two sides of the first region 203a. The first region 203a forms a channel at a central part of the semiconductor layer 203, and the second regions 203b and 203c are doped with impurities of high concentration.

A gate insulating layer 205 is formed on the buffer layer including the semiconductor layer 203. A gate electrode 207 is formed on the gate insulating layer 205, in correspondence to the first region 203a of the semiconductor layer 203 in each thin film transistor (TR).

A scan line (SL), which is connected to the gate electrode 207 of a switching thin film transistor (not shown) and extending toward one direction, is formed on the gate insulating layer 205. An insulating layer 209, made of an insulating material, e.g., an inorganic insulating material such as silicon dioxide ($SiO_2$) or silicon nitride (SiNx), is formed on the entire surface of the active area (A/A) of the substrate 201 including the gate electrode 207 and the scan line (SL).

A data line (DL) which defines a pixel (PX) by crossing the scan line (SL), and a power supply line (VDDL) spaced from the data line (DL) is formed on the insulating layer 209.

A source electrode 213a and a drain electrode 213b, which are made of the same second metallic material as the data line (DL) and are spaced from each other, are formed at each of a switching thin film transistor and a driving thin film transistor (TR), on the insulating layer 209. The source electrode 213a and the drain electrode 213b contact the second regions 203b and 203c exposed to outside through contact holes (not shown).

Interlayer insulating layers 215 and 215a, which have a drain contact hole (not shown) through which the drain electrode 213b is exposed to outside, are laminated on the driving thin film transistor (TR). The interlayer insulating layers 215 and 215a are formed of an insulating material, e.g., an inorganic insulating material such as silicon dioxide ($SiO_2$) or silicon nitride (SiNx).

Especially, in the second embodiment, the outer interlayer insulating layer 215a extends up to the non-active area (N/A) from the active area (A/A) in the pixel (PX), with a greater width than a bank 223 to be explained later.

A first electrode 221, which comes in contact with the drain electrode 213b of the driving thin film transistor (TR) through a drain contact hole (not shown), is formed on the interlayer insulating layer 215. The first electrode 221 is formed in each pixel (PX).

Banks 223 and 223a, made of an insulating material, such as benzocyclobutene (BCB), polyimide or photo acryl, are formed on the first electrode 221. The central bank 223 is formed to overlap the edge of the first electrode 221 with enclosing each pixel (PX), and has a lattice shape having a plurality of openings in the entire active area (A/A). The bank 223 may extend up to the non-active area (N/A), without covering the side surface of the interlayer insulating layer 215. Under such configuration, the side surface of the outer interlayer insulating layer 215a can be exposed to outside at an edge region of the OLED display panel.

As the outer interlayer insulating layer 215a is exposed to outside by the bank 223 in the non-active area (N/A), the side surfaces of the outer interlayer insulating layer 215a and the bank 223 have a stair shape with a gradual inclination angle. Accordingly, foreign materials introduced into the side surfaces of the outer interlayer insulating layer 215a and the bank 223 can be easily removed.

An organic light-emitting layer 225, made up of organic light-emitting patterns (not shown) which emit red, green and blue light, is formed on the first electrode 221 enclosed by the banks 223 and 223a in each pixel (PX). A second electrode 227 is formed on the organic light-emitting layer 225 and the banks 223 and 223a, on the entire surface of the active area (A/A). The first electrode 221, the second electrode 227, and the organic light-emitting layer 225 interposed between the first electrode 221 and the second electrode 227, form an organic light-emitting diode (OLED).

A first passivation layer 229, made of an insulating material, especially, an inorganic insulating material such as silicon dioxide ($SiO_2$) or silicon nitride (SiNx), is formed on the entire surface of the substrate including the second electrode 227. There is a limitation to prevent water from being introduced to the organic light-emitting layer 225, using only the second electrode 227. Accordingly, the first passivation layer 229 is formed on the second electrode 227, so that introduction of water to the organic light-emitting layer 225 can be prevented more easily.

An organic layer 231, made of an organic material such as polymer, is formed on the active area (A/A) on the first passivation layer 229. The first passivation layer 229 extends up to the non-active area (N/A), with its side surface having a gradual inclination angle.

A second passivation layer 233 is formed on the entire surface of they substrate 201 including the organic layer 231, in order to prevent introduction of water into the OLED display panel through the organic layer 231. The second passivation layer 233 is configured to completely cover the organic layer 231 and the first passivation layer 229 formed therebelow. A barrier film 237 is attached onto the entire surface of the substrate including the second passivation layer 233, using an adhesive 235.

In the OLED display panel according to the second embodiment of the present invention, the interlayer insulating layer is formed to have a greater width than the bank, on the non-active area. The side surface of the interlayer insulating layer is exposed to outside when viewed from the upper side. And an inclination angle formed by the side surfaces of the interlayer insulating layer and the bank is gradual in an edge region of the OLED display panel. Under such configuration, foreign materials introduced into the side surfaces of the interlayer insulating layer and the bank can be easily removed. This can enhance reliability of the OLED display panel.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light-emitting diode display panel, comprising:
    a substrate divided into an active area which defines a plurality of pixels, and a non-active area formed to enclose the active area;
    a plurality of signal lines and thin film transistors formed on the substrate;
    an interlayer insulating layer formed on the substrate including the thin film transistors, configured to expose one electrode of the thin film transistors to outside, and extending up to the non-active area;
    a first electrode formed on the interlayer insulating layer, and connected to said one electrode;
    a bank formed on the substrate including the first electrode such that a side surface of the interlayer insulating layer is exposed to outside;
    an organic light-emitting layer formed on the first electrode in each pixel;
    a second electrode on the organic light-emitting layer in an entire part of the active area;
    a first passivation layer formed on an entire surface of the substrate including the second electrode;
    an organic layer formed on the first passivation layer;
    a second passivation layer formed on the first passivation layer including the organic layer;
    a barrier film disposed in correspondence to the substrate; and
    an adhesive layer interposed between the substrate and the barrier film, and configured to adhere the substrate and the barrier film to each other.

2. The device of claim 1, wherein the interlayer insulating layer and the bank are formed such that side surfaces thereof form a stair shape.

3. The device of claim 1, wherein the first passivation layer is formed to completely cover the interlayer insulating layer and the bank.

4. The device of claim 1, wherein the substrate is formed of a plastic material having a flexible characteristic.

* * * * *